(12) United States Patent
Lam et al.

(10) Patent No.: US 8,517,322 B2
(45) Date of Patent: Aug. 27, 2013

(54) MOUNTING BRACKET

(75) Inventors: William Phuong Lam, Brookfield, IL (US); Dugan O'Keene, Forest Park, IL (US); Garry Monaco, Hoffman Estates, IL (US)

(73) Assignee: Peerless Industries, Inc., Aurora, IL (US)

( * ) Notice: Subject to any disclaimer, the term of this patent is extended or adjusted under 35 U.S.C. 154(b) by 0 days.

(21) Appl. No.: 12/901,177

(22) Filed: Oct. 8, 2010

(65) Prior Publication Data
US 2011/0024589 A1 Feb. 3, 2011

Related U.S. Application Data

(63) Continuation of application No. 11/541,343, filed on Sep. 29, 2006, now Pat. No. 7,823,850.

(60) Provisional application No. 60/727,105, filed on Oct. 14, 2005.

(51) Int. Cl.
*E04G 3/00* (2006.01)

(52) U.S. Cl.
USPC .. 248/292.14; 248/921; 248/923; 361/679.02

(58) Field of Classification Search
USPC ................. 248/274.1, 292.14, 919, 920, 921, 248/922, 923; 361/681, 682, 683
See application file for complete search history.

(56) References Cited

U.S. PATENT DOCUMENTS

| | | | |
|---|---|---|---|
| D493,800 S | 8/2004 | Pfister et al. | |
| D494,596 S | 8/2004 | Pfister | |
| D497,537 S | 10/2004 | O'Keene et al. | |
| 6,905,101 B1 | 6/2005 | Dittmer | |
| D530,595 S | 10/2006 | Lam et al. | |
| 7,152,836 B2 | 12/2006 | Pfister et al. | |
| 7,178,775 B2 | 2/2007 | Pfister et al. | |
| D538,141 S | 3/2007 | Stenhouse et al. | |
| D561,775 S | 2/2008 | Wohlford et al. | |
| 7,334,766 B2 | 2/2008 | Ligertwood | |
| 7,438,269 B2 | 10/2008 | Pfister et al. | |
| 2004/0232301 A1 | 11/2004 | Bremmon et al. | |
| 2005/0133678 A1 | 6/2005 | Dittmer | |
| 2005/0263659 A1 | 12/2005 | Pfister et al. | |
| 2006/0065800 A1 | 3/2006 | Bremmon | |
| 2007/0023599 A1 | 2/2007 | Fedewa | |

(Continued)

OTHER PUBLICATIONS

Sanus Systems, The Union of Form and Function, Assembly Instructions for VMPL2 Flat Panel Wall Mount, Sanus Systems, Sep. 29, 2005.

(Continued)

*Primary Examiner* — Terrell McKinnon
*Assistant Examiner* — Steven Marsh
(74) *Attorney, Agent, or Firm* — Foley & Lardner LLP

(57) ABSTRACT

An improved mounting bracket that provides an indication to an installer when a mount is not correctly aligned. The mounting bracket comprises a mounting contact portion and at least one side portion integrally connected to the mounting contact portion, with the at least one side portion defining a receiving region for accepting one or more retaining portions of a mount. The at least one side portion includes a first ramped surface at least partially outside of the receiving region. The first ramped surface configured to contact a retaining portion when the retaining portion is misaligned with the receiving region, thereby informing an installer of the misalignment.

24 Claims, 8 Drawing Sheets

(56) References Cited

U.S. PATENT DOCUMENTS

| | | | |
|---|---|---|---|
| 2007/0262215 A1 | 11/2007 | Tan | |
| 2008/0156949 A1* | 7/2008 | Sculler et al. | 248/220.21 |
| 2008/0237426 A1* | 10/2008 | Walters | 248/316.8 |
| 2009/0084918 A1* | 4/2009 | Pfister et al. | 248/292.14 |

OTHER PUBLICATIONS

Defendants' Amended Answer for Affirmative Defenses to Plaintiff's Third Amended Complaint, dated Sep. 20, 2011, *Peerless Industries Inc.* v. *Crimson AV, LLC, Vladimir Gleyzer*, United States District Court for the Northern District of Illinois Eastern Division, Case No. 1:11-cv-1768.

Plaintiff Peerless Industries, Inc.'s Initial Infringement Contentions, dated Aug. 2, 2011, *Peerless Industries Inc.* v. *Crimson AV, LLC, Vladimir Gleyzer*, United States District Court for the Northern District of Illinois Eastern Division, Case No. 1:11-cv-1768.

First Supplement to Defendant Crimson AV, LLC's Initial Invalidity and Non-Infringement Contentions, dated Sep. 12, 2011, *Peerless Industries Inc.* v. *Crimson, AV LLC, Vladimir Gleyzer*, United States District Court for the Northern District of Illinois Eastern Division, Case No. 1:11-cv-1768.

Plaintiff Peerless Industries, Inc.'s Initial Response to Crimson's First Supplemental to Its Initial Invalidity Contentions, dated Sep. 26, 2011, *Peerless Industries Inc.* v. *Crimson, AV LLC, Vladimir Gleyzer*, United States District Court for the Northern District of Illinois Eastern Division, Case No. 1:11-cv-1768.

Defendant Crimson AV, LLC's Initial Invalidity and Non-Infringement Contentions, dated Aug. 29, 2011, *Peerless Industries Inc.* v. *Crimson, AV LLC, Vladimir Gleyzer*, United States District Court for the Northern District of Illinois Eastern Division, Case No. 1:11-cv-1768.

Second Supplement to Defendant Crimson AV, LLC's Initial Invalidity and Non-Infringement Contentions, Case No. 1:11-cv-1768, *Peerless Industries, Inc.* v. *Crimson AV, LLC, Vladimir Gleyzer*, Oct. 24, 2012.

"Third Supplement to Defendant Crimson AV, LLC's Initial Invalidity and Non-Infringement Contentions," *Peerless Industries, Inc.*, v. *Crimson AV LLC, Vladimir Gleyzer*, Case No. 1:11-cv-1768, filed Jun. 20, 2013, 49 pages.

"Crimson's Memorandum of Law in Opposition to Plaintiff's Motion for partial Summary Judgement As to Count 1 and in Support of Crimson's Cross-Motion for Invalidity." *Peerless Industries, Inc.*, v. *Crimson AV LLC, Vladimir Gleyzer*, Case No. 1:11-cv-1768, filed Apr. 5, 2013, 22 pages.

"Crimson LR 56.1 Statement of Additional Material Facts." *Peerless Industries, Inc.*, v. *Crimson AV LLV, Vladimir Gleyzer*, Case No. 1:11-cv-1768, filed Apr. 5, 2013, 30 pages.

"Exhibits to Crimson's Statement of Additional Material Facts Exh 1," *Peerless Industries, Inc.*, v. *Crimson AV LLC, Vladimir Gleyzer*, Case No. 1:11-cv-1768, filed Apr. 5, 2013, 17 pages.

"Exhibits to Crimson's Statement of Additional Material Facts Exh 2," *Peerless Industries, Inc.*, v. *Crimson AV LLC, Vladimir Gleyzer*, Case No. 1:11-cv-1768, filed Apr. 5, 2013, 184 pages.

"Exhibits to Crimson's Statement of Additional Material Facts Exh 3," *Peerless Industries, Inc.*, v. *Crimson AV LLC, Vladimir Gleyzer*, Case No. 1:11-cv-1768, filed Apr. 5, 2013, 19 pages.

"Exhibits to Crimson's Statement of Additional Material Facts Exh 5," *Peerless Industries, Inc.*, v. *Crimson AV LLC, Vladimir Gleyzer*, Case No. 1:11-cv-1768, filed Apr. 5, 2013, 8 pages.

"Exhibits to Crimson's Statement of Additional Material Facts Exh 6," *Peerless Industries, Inc.*, v. *Crimson AV LLC, Vladimir Gleyzer*, Case No. 1:11-cv-1768, filed Apr. 5, 2013, 4 pages.

"Exhibits to Crimson's Statement of Additional Material Facts Exh 7," *Peerless Industries, Inc.*, v. *Crimson AV LLC, Vladimir Gleyzer*, Case No. 1:11-cv-1768, filed Apr. 5, 2013, 8 pages.

"Exhibits to Crimson's Statement of Additional Material Facts Exh 8," *Peerless Industries, Inc.*, v. *Crimson AV LLC, Vladimir Gleyzer*, Case No. 1:11-cv-1768, filed Apr. 5, 2013, 2 pages.

"Exhibits to Crimson's Statement of Additional Material Facts Exh 9," *Peerless Industries, Inc.*, v. *Crimson AV LLC, Vladimir Gleyzer*, Case No. 1:11-cv-1768, filed Apr. 5, 2013, 2 pages.

"Peerless' Reply in Support of Its Motion for Partial Summary Judgement As to Count 1," *Peerless Industries, Inc.*, v. *Crimson AV LLC, Vladimir Gleyzer*, Case No. 1:11-cv-1768, filed Jun. 28, 2013, 20 pages.

"Response to Crimson's Local Rule 56.1 Statement of Additional Material Facts," *Peerless Industries, Inc.*, v. *Crimson AV LLC, Vladimir Gleyzer*, Case No. 1:11-cv-1768, filed Jun. 28, 2013, 34 pages.

* cited by examiner

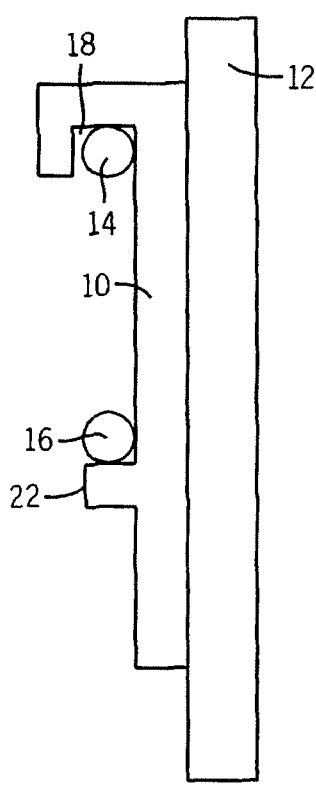 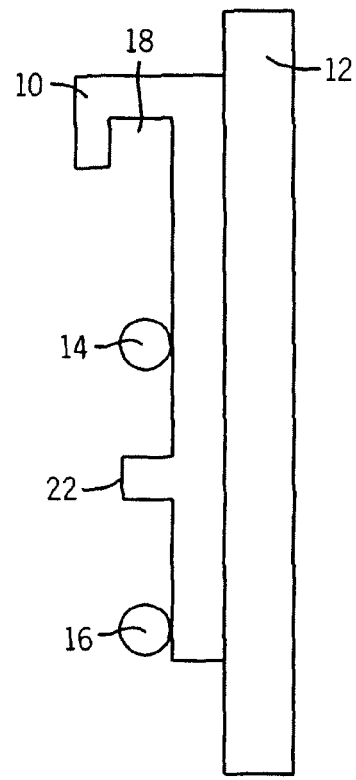
FIG. 1  
Prior Art
FIG. 2  
Prior Art

MOUNTING BRACKET

CROSS-REFERENCE TO RELATED APPLICATIONS

The present application is a continuation of U.S. patent application Ser. No. 11/541,343, filed Sep. 29, 2006, which claims priority to U.S. Provisional Patent Application No. 60/727,105, filed Oct. 14, 2005. The contents of these applications are incorporated herein by reference in their entirety.

FIELD OF THE INVENTION

The present invention relates generally to mounting brackets. More particularly, the present invention relates to brackets that are used in conjunction with systems for mounting devices such as flat panel televisions.

BACKGROUND OF THE INVENTION

In recent years, flat-panel televisions have become enormously popular in both the commercial and the residential sectors. As the prices for plasma and liquid crystal display (LCD) flat panel displays have continued to fall, and as the quality for the same devices have improved, more and more business and individuals have purchased such devices both for business and home entertainment purposes.

One of the advantages of flat-panel television units that customers have found particular appealing is their relatively low thickness. Because conventional "tube" televisions have a relatively large depth, the display options for such devices are quite limited. In the residential setting, most users require a television stand or large entertainment center to store the television. Such stands or entertainment centers can take up significant floor space, which is often undesirable. In the commercial or educational setting, users will often install large overhead mounting systems that can contain the television. However, these systems usually require professional installation and, once the television is secured in the mount, it is often very difficult to access and adjust due to its height.

With flat-panel televisions, on the other hand, users are presented with a relatively new option: mounting the television directly to a wall. By mounting the television to a wall, a person can eliminate the need to take up potentially valuable floor space with a television stand or entertainment unit.

Although the introduction of flat-panel televisions on a wide scale has presented new opportunities to both residential and commercial customers, it has also presented new challenges. In particular, flat panel televisions, while usually having a significantly smaller depth or profile than conventional tube televisions, tend to be quite heavy. Particularly for flat panel televisions with large screens, this weight can become also prohibitively great. With such large weights involved, it is especially important that users can easily, safely, and securely mount the devices without having to make substantial adjustments. Furthermore, with such weights involved and the high costs of such devices, it is extremely important that the device be mounted correctly on the first attempt; if the device is not correctly mounted on the first try, there is a high risk of damaging the device and causing injury to those installing it.

With the above considerations in mind, there have been various attempts to develop mounting systems that address these concerns. However, each system still maintains serious drawbacks. A number of such systems involve the use of mounting brackets that are attached to either the television or to the wall. Prior art FIG. 1 shows one such arrangement, where a prior art mounting bracket 10, which is fixedly secured to a flat panel television 12, must properly mate with first and second retaining portions 14 and 16 of a wall-attached mount. For a proper mating, an upper cavity 18 of the mounting bracket 10 captures the first retaining portion 14, while a lower protrusion is positioned immediately below the second retaining portion 16. However, and as depicted in prior art FIG. 2, if the user slightly misaligns the mounting bracket 10 such that the protrusion 22 is positioned above the second retaining portion 16, then the upper cavity 18 will not receive the first retaining portion 14 due to the impeding of the second retaining portion 16. During this process, the installer must essentially perform this mating while "blind" in that he or she cannot see the position of the first and second retaining portions 14 and 16. As a result, he or she may not know that the upper cavity 18 has not captured the first retaining portion 14 and, if the user lets go of the flat panel television 12, it is likely to fall, causing substantial damage to the flat panel television 12 and potential injury to the installer and/or bystanders. The same problem can occur if the mounting bracket 10 is attached to the wall and the mount is attached to the flat panel television 12.

It would therefore be desirable to develop a system where an installer could quickly and easily determine whether the various mount components are correctly aligned during the installation process.

SUMMARY OF THE INVENTION

The present invention provides for an improved mounting bracket which provides clear information to an installer when the mounting bracket and the remainder of the mount are not properly aligned. A system of the present invention includes one or more ramping surfaces extending away from the correct mounting positions on the mounting bracket. The ramping surface or surfaces may either be formed as part of the respective mounting brackets, or the ramping surfaces may comprise separate components that are attached to the mounting bracket. If the mounting bracket is positioned too high and/or too low relative to the rest of the mount, one of the mount's retaining portions will come into contact with a ramp. The contact of the ramp against the retaining portion will cause the mounting bracket to slide, providing a clear indication to the user that the mounting bracket is not properly aligned with the retaining portions.

With the present invention, the possibility of a mounting bracket being misaligned relative to the retaining portions is greatly reduced. As a result, the likelihood of a flat panel television falling and causing significant damage and/or bodily injury is also diminished.

These and other advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 1 is a sectional side view showing the correct mating of a prior art mounting bracket with retaining portions of a mounting system;

FIG. 2 is a sectional side view of the mounting arrangement of FIG. 1, where the prior art mounting bracket is incorrectly mated to the retaining portions;

DETAILED DESCRIPTION OF THE PREFERRED EMBODIMENTS

Figure 3:
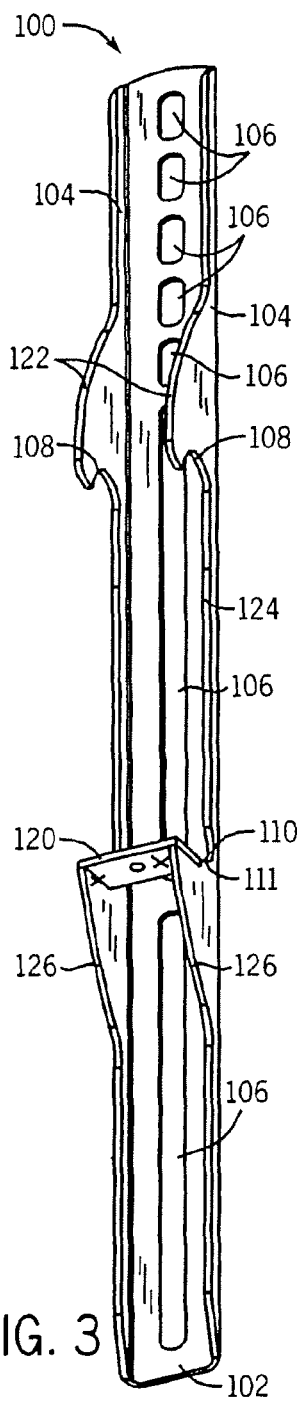
FIG. 3 is a perspective view of a mounting bracket constructed in accordance with one embodiment of the present invention.
Figure 4:
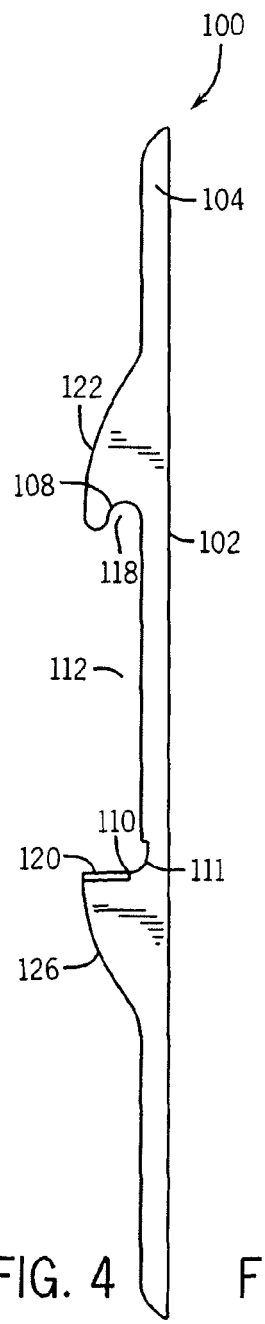
FIG. 4 is a side view of the mounting bracket of FIG. 3.
Figure 5:
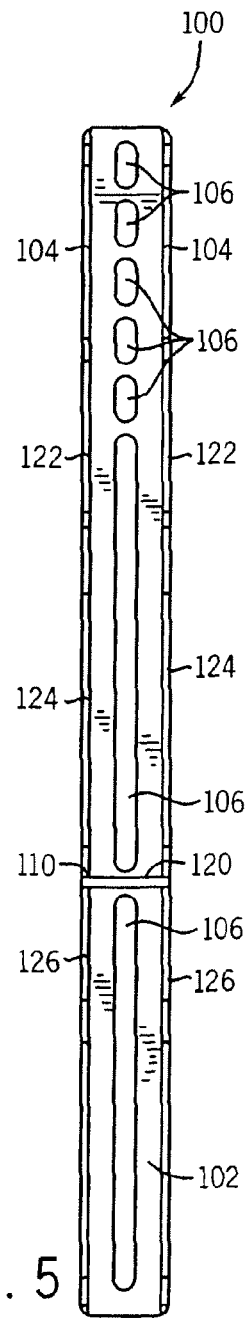
FIG. 5 is a front view of the mounting bracket of FIG. 3.
Figure 8:
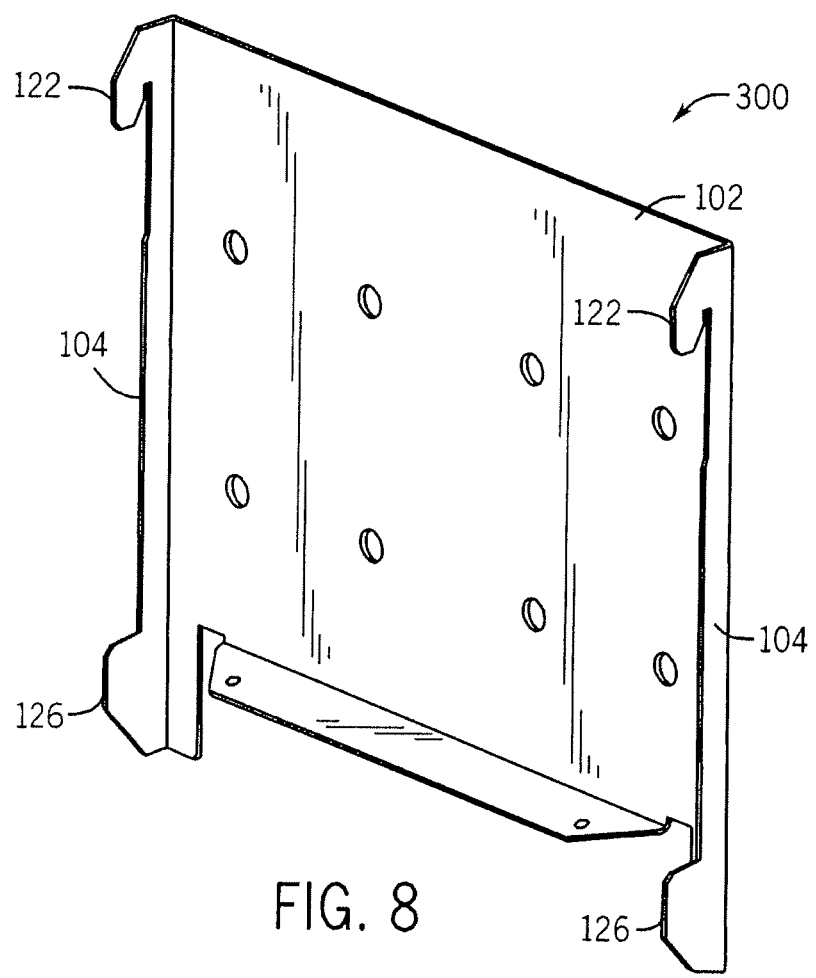
FIG. 8 is a perspective view showing a mount bracket constructed in accordance with a second embodiment of the present invention.
Figure 9:
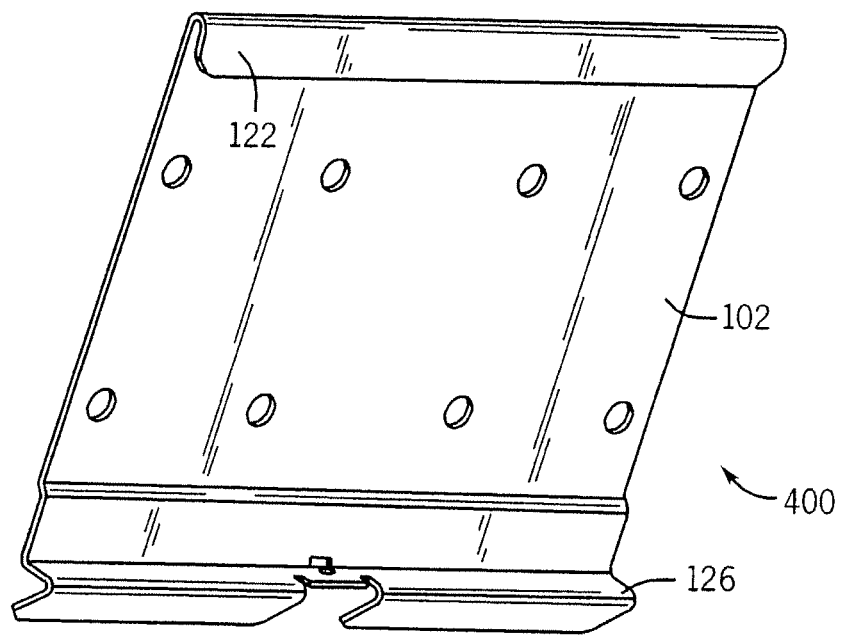
FIG. 9 is a perspective view showing a mount bracket constructed in accordance with a third embodiment of the present invention.
Figure 10:
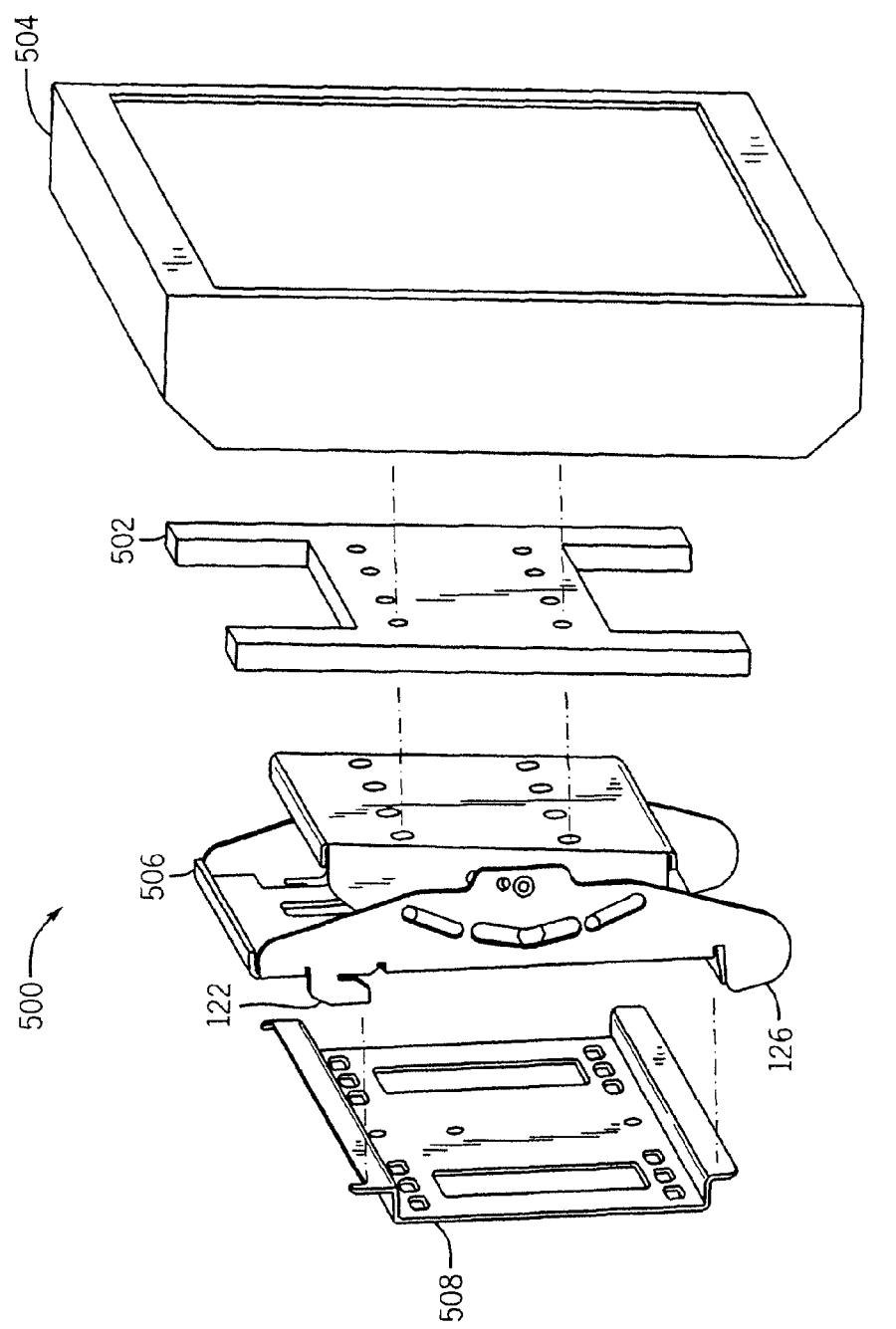
FIG. 10 is an exploded perspective view showing a mounting system including a mounting bracket constructed in accordance with a fourth embodiment of the invention.

FIGS. 3-5 show a mounting bracket 100 constructed according to one embodiment of the present invention. A mounting bracket 100 according to the present invention can take a variety of shapes. For example, the mounting bracket may be elongated, such as in the manner shown in FIGS. 3-7, or it may comprises a broader plate, as is shown in FIGS. 8-10. Each mounting bracket 100 of the present invention comprises a mounting contact portion 102 and one or more side portions 104. The side portions 104, in a particular embodiment of the invention, are substantially perpendicular to the mounting contact portion 102. In other embodiments, it is also possible for the side portions 104 to be at a non-perpendicular angle to the mounting contact portion 102. In one embodiment of the invention, the mounting contact portion 102 and the pair of side portions 104 are formed as a single piece of material, such as aluminum or steel. In other embodiments, it is also possible for the contact portion 102 and the side portions 104 to be formed as separate components which are later coupled together.

The mounting contact portion 102 includes a plurality of mounting slots 106 formed therein. The mounting slots 106 are used to couple the mounting bracket 100 to a flat panel display (not shown) in one embodiment of the invention. Alternatively, the mounting slots 106 may be used to couple the mounting bracket 100 to a wall or other surface in a different embodiment of the invention.

Figures 6A, 6B:
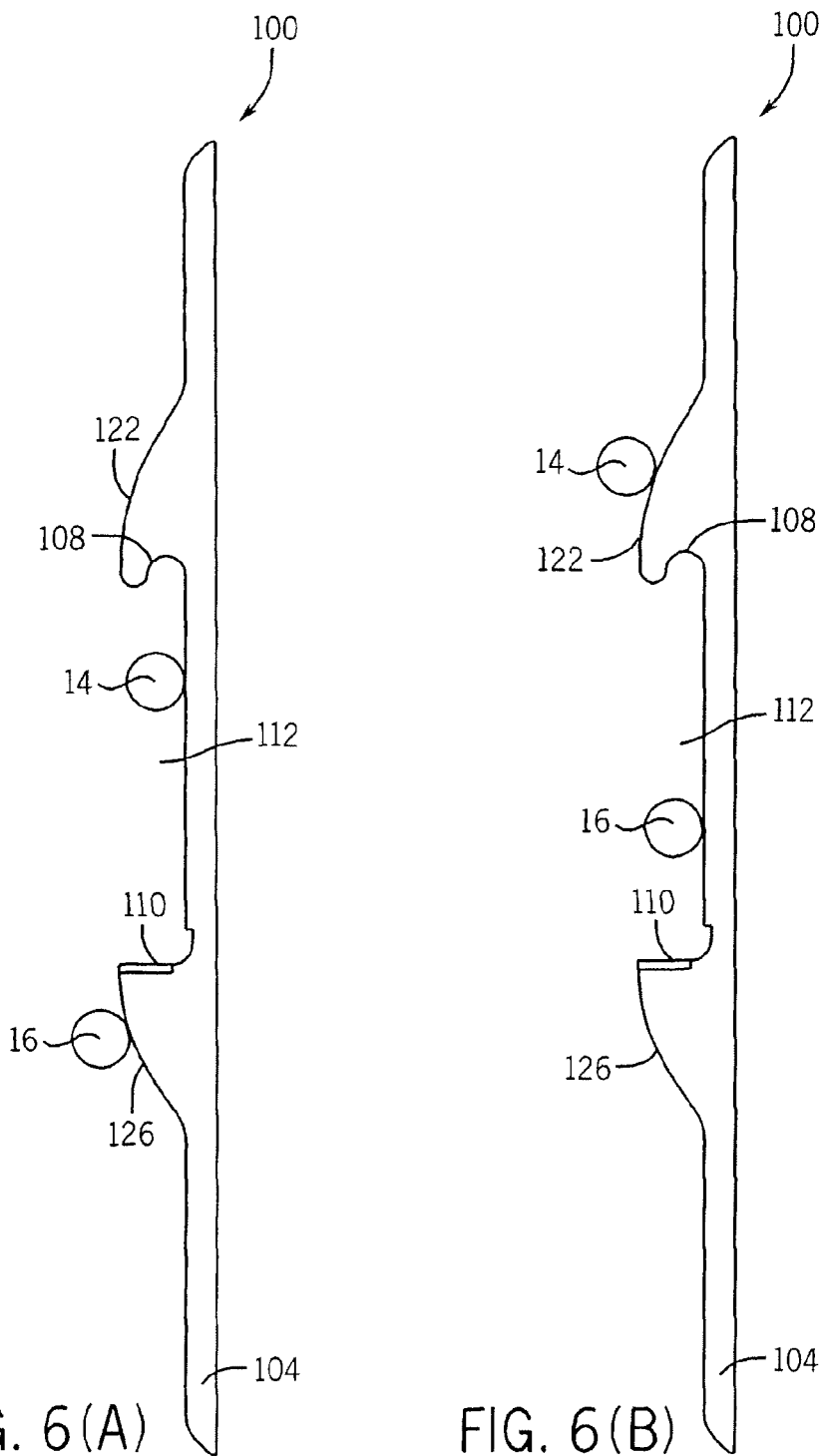
FIG. 6(a) is a sectional side view showing the circumstances involved when a mounting bracket of the present invention is misaligned with the retaining portions of a mounting system in a first manner.
FIG. 6(b) is a sectional side view showing the circumstances involved when a mounting bracket of the present invention is misaligned with the retaining portions of a mounting system in a second manner.

As shown in FIGS. 3-4, the mounting bracket 100 includes an upper hook 108 and a lower guiding portion 110 on each side portion 104, which together define a receiving region 112 for first and second retaining portions 14 and 16 (shown in FIGS. 6A and 6B). It should be noted that the first and second retaining portions 14 and 16 can comprise separate bars, or they can simply constitutes different portions of the same component. The upper hook 108 defines an upper indentation 118 for receiving the first retaining portion 14. The upper hook 108 is formed on each of the side portions 104 at substantially the same position. Each upper hook 108 and/or guiding portion 110 may be formed as one piece with the rest of the mounting bracket 100 or, alternatively, each upper hook 108 and/or guiding portion 110 may comprise a separate component which is coupled to the mounting bracket 100 in the appropriate position.

The guiding portion 110, which is positioned below the upper hook 108 in one embodiment of the invention, includes a longitudinal surface 120. The longitudinal surface 120 may comprise the same type of material as the rest of the mounting bracket 100 and may be welded to the pair of side portions 104 or fastened in other conventionally-known manners. The guiding portion 110 may also terminate at a slight indentation 111 sized for receiving a retaining portion, as is discussed below.

Both the upper hook 108 and the guiding portion 110 are spaced apart from each other at a distance such that the first and second retaining portions 14 and 16 of the type shown in FIGS. 1, 2, 6(a), 6(b) and 7 can fit therebetween. More particularly, when properly mated, the first retaining portion 14 fits snugly within the upper hook 108, while the second retaining portion 16 rests on the guiding portion 110.

According to one embodiment of the present invention, for each side portion 104, the upper hook 108 includes one or more upper ramping surfaces 122 on the outside thereof. Each upper ramping surface 122 is formed as part of the side portions 104 in one particular embodiment of the invention. In an alternative embodiment of the invention, the upper ramping surface 122 is formed as one or more separate component, which are then coupled to the mounting bracket 100 at a desired location. In the embodiment shown in FIGS. 3-7, the upper ramping surface 122 includes a gradual but noticeable curve as it approaches a lower profile, recessed portion 124 of the side portion 104. However, it should also be noted that each upper ramping surface 122 can possess various levels of curvature, or it could have no curvature at all.

Similarly and according to one embodiment of the present invention, for each side portion 104, one or more lower ramping surfaces 126 are positioned immediately below the guiding portion 110. Each lower ramping surface 126 is formed as part of the side portions 104 in one particular embodiment of the invention. In an alternative embodiment of the invention, each upper ramping surface 126 is formed as one or more separate component, which are then coupled to the mounting bracket 100 at a desired location. In the embodiment shown in FIGS. 3-7, each lower ramping surface 126 includes a gradual but noticeable curve as it approaches the lower profile, recessed portion 124 of the side portion 104. However, it should also be noted that each lower ramping surface 126 can possess various levels of curvature, or each lower ramping surface 126 could have no curvature at all.

According to the present invention, each upper ramping surface 122 and each lower ramping surface 126 are angled such that, if a mount is incorrectly aligned either the first retaining portion 14 will contact an upper ramping surface 122 or the second retaining portion 16 will contact a lower ramping surface 126. FIGS. 6(a) and 6(b) show two such scenarios where misalignment occurs. In FIG. 6(b), the flat panel display and mounting bracket 100 or brackets are positioned too low relative to the mount. In this scenario, the receiving region 112 accepts the first retaining portion 14 therein. However, as the flat panel television or other device moves toward the mount, the second retaining portion 16 comes into direct contact with the lower ramping surfaces 126. As a result of this contact, the flat panel television cannot be oriented substantially upright relative to the floor, and the lower ramping surfaces 126 will cause the mounting bracket 100 or brackets (and the attached flat panel television) to slide along the lower ramping surface 126. Therefore, the installer is provided with a clear indication that the flat panel television or other device is not correctly positioned for mounting. Because the installer's view of the mount and the mounting bracket 100 or brackets is blocked by the flat panel display, this feature provides the installer with valuable information which otherwise may not be available to him or her.

It should be noted that the term "ramping surface" as discussed herein should not be interpreted as requiring that the surface in question be angled by any specified amount relative to other components. Instead, this term should be understood as only requiring some form of offset that would inform a user of a misalignment as discussed herein.

FIG. 6(a) shows the scenario where the flat panel display and mounting bracket 100 or brackets are positioned too high relative to the mount. In this scenario, the receiving region 112 accepts the second retaining portion 16 therein. However, as the flat panel television or other device moves toward the mount, the first retaining portion 14 comes into direct contact with the upper ramping surfaces 122. As a result of this contact, the flat panel television cannot be oriented substantially upright relative to the floor, and the upper ramping surface 122 will cause the mounting bracket 100 or brackets (and the attached flat panel television) to slide along the upper ramping surfaces 122. Therefore, the installer once again is provided with a clear indication that the flat panel television or other device is not correctly positioned for mounting.

Figure 7:
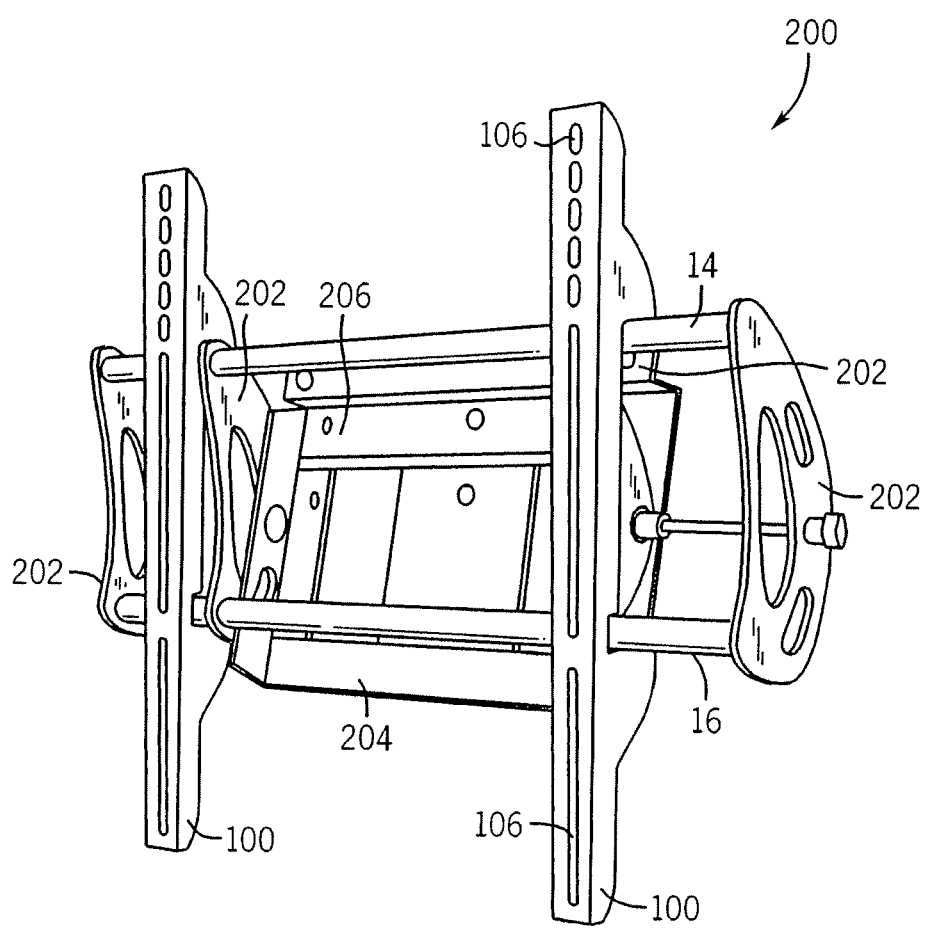
FIG. 7 is a perspective view showing a pair of mounting brackets constructed according the principles of the present invention when correctly mated with the remainder of a mounting system.

FIG. 7 is a perspective view of a representative mounting system 200 where two mounting brackets constructed according to the present invention are correctly attached to the first and second retaining portions 14 and 16. In the mounting system of FIG. 7, two mounting brackets 100 are used and are configured to cooperatively support a flat panel television or display. However, it is also possible to use fewer or more mounting brackets 100 depending upon the size of the flat panel television being supported. It is additionally possible for the mounting brackets 100 to support devices other than flat panel televisions as necessary or desired. Still further, it is also possible for the mounting brackets 100 to be secured to a wall, while the remainder of the mounting system 200 is secured to the back of a device. It is also possible for the mounting bracket 100 or brackets comprise intermediate interface members which do not directly attach to the back of the device. For example, the mounting bracket 100 or brackets can attached to another interface member, which in turn couples direct to the back of a device.

In the mounting system 200 of FIG. 7, the mounting brackets 100 have correctly accepted the first and second retaining portions 14 and 16. The first and second retaining portions 14 and 16 are operatively connected to each other via a plurality of retaining portion plates 202. In the embodiment shown in FIG. 7, two of the retaining portion plates 202 are rotatably connected to a base plate 204 via a plurality of rolling pins 206. However, it should be noted that other components, such as gliders (not shown), may also be used to effectuate this connection. Furthermore, it is also possible for this connection to be fixed and not capable of any rotation at all. The base plate 204 can be coupled to a wall mounting plate (not shown) for securement to a wall or other mounting surface (not shown). Alternatively, the base plate 204 can be directly secured to the wall or other mounting surface.

FIG. 8 shows a mounting bracket 300 constructed in accordance with a second embodiment of the present invention. The mounting bracket 300 of FIG. 8 is similar to the mounting bracket 100 of FIGS. 3-7. However, the mounting bracket 300 of FIG. 8 includes a substantially larger mounting contact portion 102 than that shown in FIGS. 3-7. Additionally, it should be noted that the upper and lower ramping surfaces 122 and 126 are substantially straight in nature and include no substantial curvature.

FIG. 9 shows a mounting bracket 400 constructed in accordance with a third embodiment of the present invention. Unlike the embodiments shown in FIGS. 3-8, the mounting bracket 400 of FIG. 9 does not include any side portions whatsoever. Instead, the upper and lower ramping surfaces 122 and 126 are formed directly out of the top and bottom of the mounting contact portion 102. It should be noted that the upper and lower ramping surfaces 122 and 126 can also be formed from separate components which are then coupled to the mounting contact portion 102.

Figure 11:
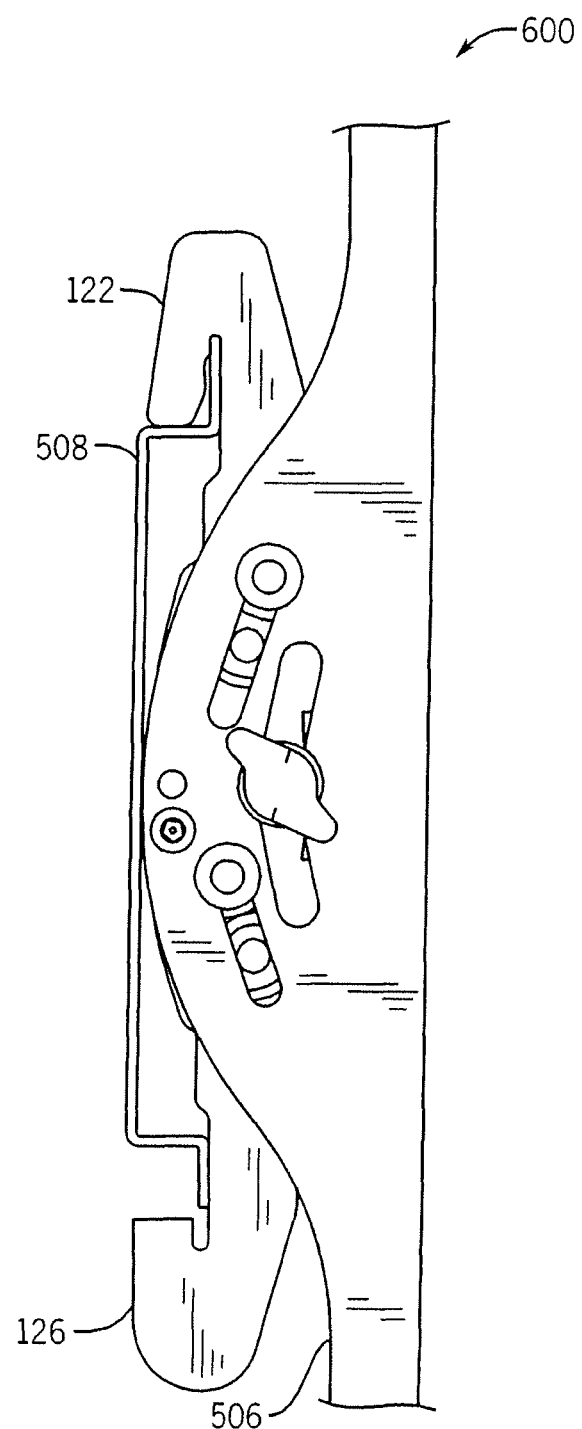
FIG. 11 is a side view of a mounting system including a mounting bracket constructed in accordance with a fifth embodiment of the present invention.

FIG. 10 shows a mounting system 500 constructed according to still another embodiment of the present invention. The mounting system 500 of FIG. 10 includes a screen mounting plate 502 that is used to couple a display unit 504 to an interface assembly 506. The interface assembly 506 includes upper ramps 122 and lower ramps 126 as discussed above, and is also configured to attach to a wall plate 508 which attaches to a wall (not shown). In this embodiment, retaining portions 510 are formed from the wall plate 508. FIG. 11 shows another mounting system 600 comprising a similar embodiment of the present invention.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. For example, all of the individual items which together make up a mounting bracket 100 may be formed from a single piece of material, or they can be formed as different components which are subsequent coupled to each other using conventional processes. It is also possible for various components to be rotated by ninety degrees, i.e., so that the side portions 104 are located on the top and bottom of the mounting bracket 100, for example. The embodiments were chosen and described in order to explain the principles of the present invention and its practical application to enable one skilled in the art to utilize the present invention in various embodiments and with various modifications as are suited to the particular use contemplated.

What is claimed is:

1. A mounting bracket for mounting an audio/visual device to a wall-attached mount, comprising:

a mounting contact portion having a mounting contact surface configured to operatively attach to the audio/visual device, the mounting contact portion having a longitudinal length and defining a longitudinal axis;

independent and separated first and second side portions extending substantially perpendicular from the mounting contact surface, the independent and separated first and second side portions each coupled to the mounting contact portion along substantially the entirety of the longitudinal length of the mounting contact portion, the first side portion being substantially parallel to the second side portion; each of the first and second side portions comprising:

an upper non-ramped surface beginning adjacent a first end of the mounting bracket, the upper non-ramped surface disposed substantially parallel to the mounting contact surface, and an upper ramping surface extending outwardly from the mounting contact portion and disposed substantially parallel to the longitudinal axis, the upper ramping surface defining an incline beginning adjacent the upper non-ramped surface and terminating in a hook configured to accept a first retaining portion of the wall-attached mount; and a receiving region extending substantially parallel to the longitudinal axis and configured to receive, proximate the mounting contact portion and the hook, the first retaining portion of the wall-attached mount, wherein the upper ramping surface is configured to contact the first retaining portion of the wall-attached mount to indicate a misalignment between the mounting bracket and the wall-attached mount.

2. The mounting bracket of claim 1, further comprising a lower ramping surface extending outwardly from the mounting contact portion and disposed substantially parallel to the longitudinal axis, the lower ramping surface defining an incline terminating at a lower guiding portion opposite the upper hook, wherein one of the upper ramping surface and lower ramping surface is configured to contact one of the first retaining portion and a second retaining portion of the wall-attached mount when only the other of the first portion and the second portion is received by the receiving region to indicate a misalignment between the mounting bracket and the wall-attached mount.

3. The mounting bracket of claim 2, wherein the upper ramping surface and the lower ramping surface are each inclined toward the receiving region such that the upper ramping surface and the lower ramping surface are substantially increasingly displaced from the mounting contact portion as the upper ramping surface and the lower ramping surface approach the receiving region.

4. The mounting bracket of claim 2, further comprising at least one side portion attached to the mounting contact portion, wherein the upper ramping surface and the lower ramping surface are associated with the at least one side portion.

5. The mounting bracket of claim 4, further comprising a recessed portion in the at least one side portion proximate the lower guiding portion, the recessed portion configured to engage the second retaining portion.

6. The mounting bracket of claim 1, wherein the mounting bracket is selectively moveable in relation to the wall-attached mount in a direction substantially perpendicular to the longitudinal axis when the first retaining portion and the second retaining portion are received by the receiving region.

7. The mounting bracket of claim 1, wherein the misalignment between the mounting bracket and the wall-attached mount is identified by one of an upward and a downward tilt of the mounting bracket about a substantially horizontal axis.

8. A mounting bracket for mounting an audio/visual device to a surface, the mounting bracket adapted to provide misalignment indicia between the mounting bracket and a wall-attached mount secured to the mounting surface, comprising:

a mounting contact portion including a mounting contact surface configured to operatively couple to the audio/visual device;

a pair of side portions coupled to the mounting contact portion, the pair of side portions including an open space therebetween, the pair of side portions extending substantially perpendicular from the mounting contact portion, each of the pair of side portions defining:

an upper non-ramped surface beginning adjacent a first end of the mounting bracket, the upper non-ramped surface disposed substantially parallel to the mounting contact surface, and an upper ramping surface variably elevated in relation to the mounting contact portion along the length of the upper ramping surface; and a receiving region located along a portion of the pair of side portions defining a receiving aperture proximate the upper ramping surface opposite the mounting contact portion and configured to receive a portion of the wall-attached mount, wherein the upper ramping surface and the receiving region are configured to associate with the portion of the wall-attached mount such that the misalignment indicia is indicative of misalignment between the receiving portion and the portion of the wall-attached mount, and wherein the upper ramping surface is positioned between the upper non-ramped surface and the receiving region.

9. The mounting bracket of claim 8, wherein each upper ramping surface includes a hook portion proximate the receiving region.

10. The mounting bracket of claim 8, wherein each of the pair of side portions further define a lower ramping surface variably elevated in relation to the mounting contact portion along the length of the lower ramping surface.

11. The mounting bracket of claim 10, wherein the lower ramping surface includes a lower guiding portion proximate the receiving region and orientated substantially perpendicular to the mounting contact portion.

12. The mounting bracket of claim 9, wherein the hook portion partially extends into the receiving region.

13. The mounting bracket of claim 8, wherein the upper ramping surface and the lower ramping surface are each characterized by a maximum elevation proximate the receiving region.

14. The mounting bracket of claim 8, wherein the mounting bracket is selectively moveable in a substantially horizontal direction along the wall-attached mount.

15. The mounting bracket of claim 8, wherein the misalignment indicia comprises one of an upward tilt and a downward tilt of the audio/visual device about a substantially horizontal axis.

16. A method of mounting an audio/visual device to a wall-attached mount secured to a mounting surface, comprising:

bringing at least one mounting bracket operatively attached to the audio/visual device into proximity with the wall-attached mount, the at least one mounting bracket including a pair of side portions each coupled to and extending away from a mounting contact portion of the at least one mounting bracket so as to form a channel with the mounting contact portion, each of the pair of side portions including:

an upper non-ramped surface beginning adjacent a first end of the at least one mounting bracket, the upper non-ramped surface disposed substantially parallel to a mounting contact surface to which an audio/visual device is attached, an upper ramping surface arranged such that each upper ramping surface surfaces of the pair of side portions is substantially parallel to each other, and a receiving region located opposite the audio/visual device and proximate the upper ramping surface such that the upper ramping surface is positioned substantially between the upper non-ramped surface and the receiving region;

contacting the at least one mounting bracket with the wall-attached mount, the wall-attached mount including at least one retaining portion receivable by each receiving region to assemble the at least one mounting bracket and the wall-attached mount;

identifying an indicia of a substantially vertical misalignment between the assembly of the at least one mounting bracket and the wall-attached mount;

moving each upper ramping surface in relation to the at least one retaining portion in one of a substantially upward and a substantially downward direction until the at least one retaining portion is received in each receiving portion to align the at least one mounting bracket with the wall-attached mount.

17. The method of claim 16, wherein the indicia comprises a tilt of the audio/visual device about a substantially horizontal axis resulting from contact between the at least one retaining portion and one of the respective upper ramping surfaces.

18. The method of claim 16, wherein the at least one mounting bracket further includes a lower ramping surface proximate the receiving region of at least one of the pair of side portions.

19. The method of claim 18, wherein the at least one mounting bracket comprises a plurality of mounting brackets, each of the plurality of mounting brackets defining a substantially vertical longitudinal axis.

20. The method of claim 18, wherein the at least one retaining portion comprises a first retaining portion and a second retaining portion, the first retaining portion and the second retaining portion substantially parallel and orientated substantially transverse to the substantially vertical longitudinal axes.

21. The mounting bracket of claim 1, further comprising a transverse portion for guiding the positioning of one of the one or more retaining portions, the transverse portion directly joining the first and second side portions to each other.

22. The mounting bracket of claim 8, further comprising a transverse portion for guiding the positioning of one of the portion of the wall-attached mount, the transverse portion directly joining the pair of side portions to each other.

23. A mounting bracket for mounting an audio/visual device to a wall-attached mount, comprising:
   a mounting contact portion having a mounting contact surface configured to operatively attach to the audio/visual device, the mounting contact portion defining a longitudinal axis;
   first and second side surfaces extending substantially perpendicular from the mounting contact surface, the first side surface being substantially parallel to the second side surface; each of the first and second side surfaces comprising:
      an upper non-ramped surface beginning adjacent a first end of the mounting bracket, the upper non-ramped surface disposed substantially parallel to the mounting contact surface, and
      an upper ramping surface extending outwardly from the mounting contact portion and disposed substantially parallel to the longitudinal axis, the upper ramping surface defining an incline beginning adjacent the upper non-ramped surface and terminating in a hook configured to accept a first retaining portion of the wall-attached mount;
   a receiving region extending substantially parallel to the longitudinal axis and configured to receive, proximate the mounting contact portion and the hook, the first retaining portion of the wall-attached mount; and
   a transverse portion for guiding the positioning of one of the one or more retaining portions, the transverse portion directly joining the first and second side surfaces to each other,
   wherein the upper ramping surface is configured to contact the first retaining portion of the wall-attached mount to indicate a misalignment between the mounting bracket and the wall-attached mount.

24. A mounting bracket for mounting an audio/visual device to a surface, the mounting bracket adapted to provide misalignment indicia between the mounting bracket and a wall-attached mount secured to the mounting surface, comprising:
   a mounting contact portion including a mounting contact surface configured to operatively couple to the audio/visual device;
   a pair of side surfaces extending substantially perpendicular from the mounting contact portion, each of the pair of side surfaces defining:
      an upper non-ramped surface beginning adjacent a first end of the mounting bracket, the upper non-ramped surface disposed substantially parallel to the mounting contact surface, and
      an upper ramping surface variably elevated in relation to the mounting contact portion along the length of the upper ramping surface;
   a receiving region located along a portion of the pair of side surfaces defining a receiving aperture proximate the upper ramping surface opposite the mounting contact portion and configured to receive a portion of the wall-attached mount; and
   a transverse portion for guiding the positioning of one of the portion of the wall-attached mount, the transverse portion directly joining the first and second side surfaces to each other,
   wherein the upper ramping surface and the receiving region are configured to associate with the portion of the wall-attached mount such that the misalignment indicia is indicative of misalignment between the receiving portion and the portion of the wall-attached mount, and wherein the upper ramping surface is positioned between the upper non-ramped surface and the receiving region.

* * * * *